US006653712B2

(12) United States Patent
Knall et al.

(10) Patent No.: US 6,653,712 B2
(45) Date of Patent: Nov. 25, 2003

(54) THREE-DIMENSIONAL MEMORY ARRAY AND METHOD OF FABRICATION

(75) Inventors: N. Johan Knall, Sunnyvale, CA (US); Mark Johnson, Los Altos, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/153,999

(22) Filed: May 22, 2002

(65) Prior Publication Data

US 2002/0140051 A1 Oct. 3, 2002

Related U.S. Application Data (60) Division of application No. 09/814,727, filed on Mar. 21, 2001, now Pat. No. 6,420,215, which is a continuation-in-part of application No. 09/560,626, filed on Apr. 28, 2000, now abandoned.

(51) Int. Cl.[7] .......................... H01L 29/861; G11C 17/14
(52) U.S. Cl. ........................................ 257/530; 365/105
(58) Field of Search ................... 257/530, 202, 257/50, 74, 209, 529; 438/131, 129, 149, 622, 690, 467, 600; 365/130, 103, 51, 96, 105, 175

(56) References Cited

U.S. PATENT DOCUMENTS

| 3,913,224 A | 10/1975 | Preissinger et al. |
| 4,272,880 A | 6/1981 | Pashley |
| 4,442,507 A | 4/1984 | Roesner |
| 4,489,478 A | 12/1984 | Sakurai |
| 4,498,226 A | 2/1985 | Inoue et al. |
| 4,499,557 A | 2/1985 | Holmberg et al. |
| 4,500,905 A | 2/1985 | Shibata |
| 4,543,594 A | 9/1985 | Mohsen et al. |
| 4,646,266 A | 2/1987 | Ovshinsky et al. |
| 4,876,220 A | 10/1989 | Mohsen et al. |
| 4,881,114 A | 11/1989 | Mohsen et al. |
| 5,070,384 A | 12/1991 | McCollum et al. |
| 5,306,935 A | 4/1994 | Esquivel et al. |
| 5,427,979 A | 6/1995 | Chang |

(List continued on next page.)

FOREIGN PATENT DOCUMENTS

| EP | 073 486 A2 | 3/1983 |
| EP | 395 886 A2 | 7/1990 |

OTHER PUBLICATIONS

PCT Search Report, Int'l Application No. PCT/US01/13575, mailed Apr. 5, 2002, 4 pgs.

Akasaka, Yoichi, "Three–dimensional integrated circuit: technology and application prospect," Microelectronics Journal, vol. 20 Nos. 1–2 (1989), pp. 105–112.

Akasaka, Yoichi, "Three–Dimensional IC Trends," Proceedings of the IEEE, vol. 74, No. 12, (Dec. 1986), pp. 1703–1714.

(List continued on next page.)

*Primary Examiner*—Carl Whitehead, Jr.
*Assistant Examiner*—Jennifer M Dolan
(74) *Attorney, Agent, or Firm*—Blakely, Sokoloff, Taylor & Zafman LLP (57) ABSTRACT

A multi-level memory array is described employing rail-stacks. The rail-stacks include a conductor and semiconductor layers. The rail-stacks are generally separated by an insulating layer used to form antifuses. In one embodiment, one-half the diode is located in one rail-stack and the other half in the other rail-stack.

66 Claims, 8 Drawing Sheets

U.S. PATENT DOCUMENTS

| | | | |
|---|---|---|---|
| 5,535,156 A | | 7/1996 | Levy et al. |
| 5,726,484 A | * | 3/1998 | Hart et al. .................. 257/530 |
| 5,745,407 A | | 4/1998 | Levy et al. |
| 5,831,325 A | | 11/1998 | Zhang |
| 5,835,396 A | * | 11/1998 | Zhang ......................... 365/51 |
| 5,838,530 A | | 11/1998 | Zhang |
| 5,991,225 A | | 11/1999 | Forbes et al. |
| 6,034,882 A | | 3/2000 | Johnson et al. |
| 6,160,276 A | * | 12/2000 | Mohsen ..................... 257/209 |
| 6,291,836 B1 | * | 9/2001 | Kramer et al. ................ 257/50 |

OTHER PUBLICATIONS

Douglas, John H., "The Route to 3–D Chips," *high Technology*, vol. 3, No. 9, Sep. 1983, p. 55.

de Graaf, C., "A Novel High–Density Low–Cost Diode Programmable Read Only Memory," Philips Research Laboratories, Prof. Halstlaan, 4, 5656AA Eindhoven, The Netherlands.

* cited by examiner

THREE-DIMENSIONAL MEMORY ARRAY AND METHOD OF FABRICATION

This is a divisional application of Ser. No. 09/814,727 filed Mar. 21, 2001 U.S. Pat. No. 6,420,215, which is a continuation-in-part application of Ser. No. 09/560,626 filed Apr. 28, 2000, entitled Three-Dimensional Memory Array and Method of Fabrication.

BACKGROUND OF THE INVENTION

1. Field of the Invention

The invention relates to the field of vertically stacked field programmable non-volatile memory and method of fabrication.

2. Prior Art

Recently there has been an interest in fabricating memories having memory cells disposed at numerous levels above a substrate. Each level includes a plurality of spaced-apart first lines extending in one direction which are vertically separated from a plurality of parallel spaced-apart second lines in a second direction, for example, extending perpendicular to the first line. Cells are disposed between the first lines and second lines at the intersections of these lines. These memories are described in U.S. Pat. Nos. 5,835,396 and 6,034,882.

As will be seen, the present invention departs from the structures shown in these patents and uses "rail-stacks" as will be described later. The invented memory employs antifuses where a diode is formed upon programming a particular bit. In this connection see, "*A Novel High-Density Low-Cost Diode Programmable Read Only Memory*," by de Graaf, Woerlee, Hart, Lifka, de Vreede, Janssen, Sluijs and Paulzen, IEDM-96, beginning at page 189 and U.S. Pat. Nos. 4,876,220; 4,881,114 and 4,543,594.

SUMMARY OF THE INVENTION

A multi-level memory array disposed above a substrate is disclosed. A first plurality of spaced-apart rail-stacks disposed at a first height and/or a first direction are fabricated above the substrate. Each rail-stack includes a first conductor and a first semiconductor layer extending substantially the entire length of the first conductor. A second plurality of spaced-apart rail-stacks are disposed above the first rail-stacks and run in a second direction different than the first direction. An insulating layer is formed between the first rail-stack and the second conductors which is capable of being selectively breached by passing a current between one of the first and one of the second conductors to program the array.

BRIEF DESCRIPTION OF THE DRAWINGS

FIGS. 2A–2H illustrate some of the steps used to fabricate one embodiment of the invented memory.

DETAILED DESCRIPTION OF THE PRESENT INVENTION

A three-dimensional memory array which is field programmable is described. In the following description, numerous specific details are set forth such as specific materials and layer thicknesses. It will be apparent, however, to one skilled in the art that the present invention may be practiced without these details. In other instances, well-known circuits and fabrication techniques have not been set forth in detail in order not to unnecessarily obscure the present invention.

Overview of the Structure of the Invented Memory Array

The invented memory array is fabricated on several levels and, for instance, may have eight levels of storage. Each level includes partially or completely a first plurality of parallel spaced-apart rail-stacks running in a first direction and a second plurality of rail-stacks or conductors (depending on the embodiment) running in a second direction. A rail-stack may be shared by two levels of storage. Generally, the first rail-stacks run perpendicular to the second conductors/rail-stacks and hence form a right angle at their intersections.

The use of rail-stacks is a departure from prior art three-dimensional memories where conductors alone were used in lieu of rail-stacks, and where discrete cells (e.g., pillars) were formed at the intersections of the lines. As will be seen, a bit is stored at each of the intersections of rail-stacks. However, there is no apparent individual memory cell at the intersections, rather memory cells are defined by the rail-stacks and intermediate layers. This makes it easier to fabricate the invented array as will be seen. When the array is fabricated all the bits are in the zero (or one) state and after programming, the programmed bits are in the one (or zero) state.

Figure 1:
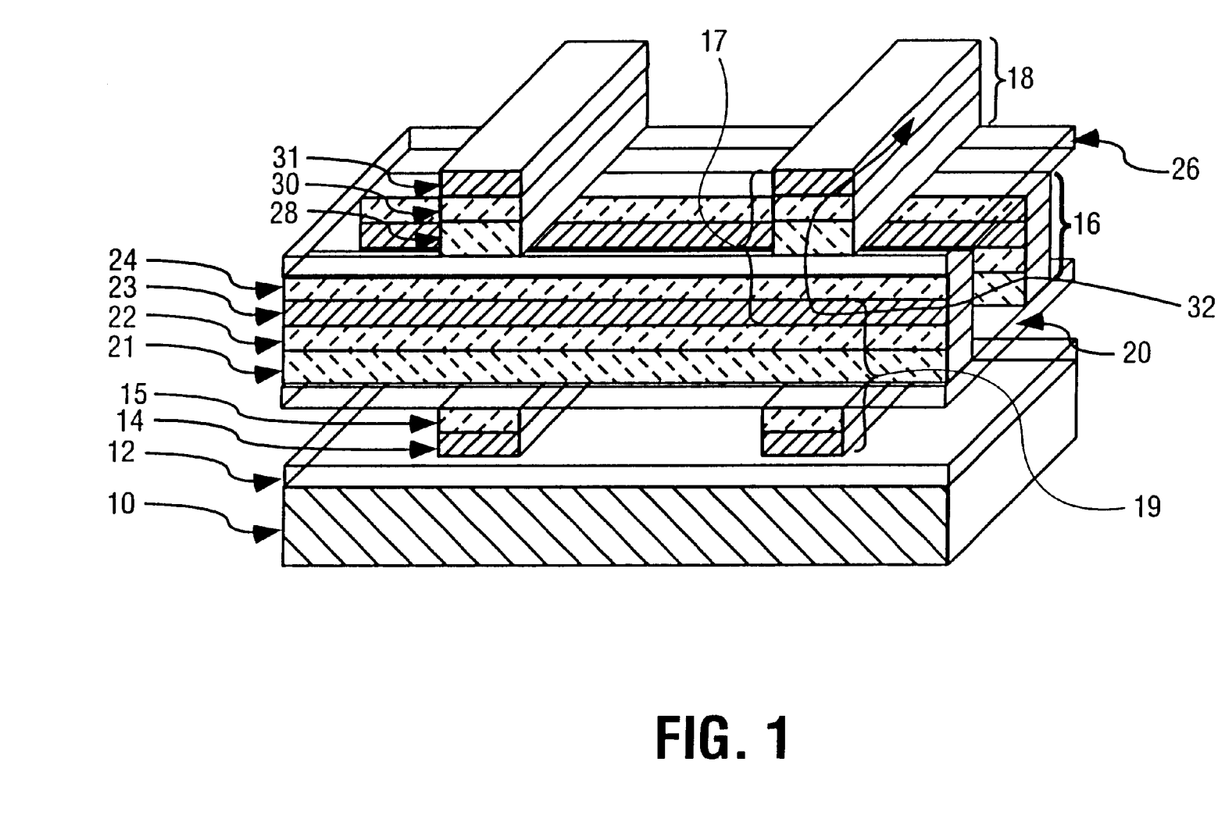
FIG. 1 is a perspective view of a cut-away portion of the invented array.

In the embodiment of FIG. 1, several rail-stacks are illustrated in the partial cross-section of the invented array. For instance, rail-stack 16 is shown at one height and a half rail-stack 18 is shown at a second height above the first height. Also, half rail-stacks are disposed between rail-stack 16 and a substrate 10. These lower half rail-stacks run in the same direction as the half rail-stack 18. A bit is stored at the intersection of rail-stacks and, for instance, a "cell" is present between the rail-stacks and layers shown within the bracket 17 and another within the bracket 19. Each of these brackets span a memory level.

The array is fabricated on a substrate 10 which may be an ordinary monocrystaline silicon substrate. Decoding circuitry, sensing circuits, and programming circuits are fabricated in one embodiment within the substrate 10 under the memory array using, for instance, ordinary MOS fabrication techniques. (These circuits may also be fabricated above the substrate.) Vias are used to connect conductors within the rail-stacks to the substrate to allow access to each rail-stack in order to program data into the array and to read data from the array. For instance, the circuitry within the substrate 10 may select rail-stack 16 and the rail stack 18 in order to either program or read a bit associated with the intersection of these rail-stacks. (In the case of the embodiments of FIG. 5 some conductors are not part of rail-stacks; these conductors are also coupled to the substrate circuits.)

As shown in FIG. 1, an insulating layer 12 is formed over the substrate in order that the array may be fabricated above the substrate. This layer may be planarized with, for instance, chemical-mechanical polishing (CMP) to provide a flat surface upon which the array may be fabricated.

Following this, a conductive layer 14 is formed on the substrate. As will be seen, conductive layers are used within the rail-stacks and these layers and the resultant conductors may be fabricated from elemental metals such as tungsten, tantalum, aluminum, copper or metal alloys may be used such as MoW. Metal silicides may also be used such as $TiSi_2$, $CoSi_2$ or a conductive compound such as TiN, WC may be used. A highly doped semiconductor layer such as silicon is also suitable. Multiple layer structures may be used selecting one or more of the above.

Following the deposition of a conductive layer, a layer of semiconductor material (layer 15) such as silicon is formed over the conductive layer. This is typically a polysilicon layer; however, an amorphous layer may be used. Other semiconductor materials may be used such as Ge, GaAs, etc. In the embodiment of FIG. 1 this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in subsequent levels.

Following this, in the embodiment of FIG. 1, a material for the antifuses used to program the array is deposited shown as layer 20. In one embodiment, the layer 20 is a dielectric such as silicon dioxide which is deposited by chemical vapor deposition (CVD) in a blanket deposition over the half rail-stacks and over the dielectric fill, filling the space between the rail-stacks. In another embodiment the layer 20 is grown on the upper surface of the silicon layer 15 and only exists on the rail-stacks. Growth of the anti-fuse can be achieved by a number of methods. Such methods include hot steam oxidation, dry thermal oxidation, plasma-oxidation, wet-chemical oxidation and electrochemical oxidation. Materials that can be used for the anti-fuse layer and that can be grown and or deposited, include; silicon dioxide, silicon nitride, silicon oxynitride, amorphous carbon and other insulating materials or combinations of materials. (Also an undoped layer of silicon may be used for the antifuse layer.)

Now a full set of memory array rail-stacks is formed on the layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22. After masking and etching, the rail-stacks shown in FIG. 1, such as rail-stack 16 are formed. These rail-stacks are, as illustrated, in a direction perpendicular to the rail-stacks above and below them.

While not shown in FIG. 1 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids. In this case chemical planarization can be used such as, for example, plasma etching. Other fill and planarization methods can be used.

After formation of the rail-stacks another antifuse layer 26 is formed, for instance, from a dielectric such as silicon dioxide.

Now another layer of rail-stacks are defined and only half rail-stacks are shown in FIG. 1 at this upper level. This half rail-stack comprises a silicon layer 28 doped with a conductivity type dopant opposite to that of layer 24. This is a lightly doped layer. Another silicon layer 30 is formed on layer 28 and this layer is doped with the same conductivity type dopant as layer 28, however, it is more heavily doped. Then a conductive layer 31 is formed above the layer 30.

Half rail-stacks are used at the very upper-most level of the array and at the very lowest level of the array. In between the half rail-stacks a number of full rail-stacks, such as rail-stack 16, are used throughout the array.

It should be noted that the silicon layers disposed on the conductive layers extend the entire length of the rail-stacks in the embodiment of FIG. 1 and are uninterrupted except possibly where vias are used to provide a conductive path to the substrate 10.

In FIG. 1 a path 32 is illustrated from a lower conductor in level 17 to an upper conductor in this level found in the rail-stack 18. This path is accessed in one embodiment through decoding circuitry in the substrate for both programming and reading of data into and from the array for one bit.

For instance, to program the bit, a relatively high write voltage, 5–20V is applied between the conductors. This relatively high voltage causes a breach in the layer 26 creating a diode. Without this high voltage, the layer 26 remains an insulator. Thus, by selecting pairs of conductors, diodes can be selectively formed so as to program the array. It is currently preferred that the write voltage be applied with a polarity such that the more positive voltage is applied to the rail-stack that constitutes the anode of the diode that is created by the breach of layer 21. It is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 26 is intact between the rail-stacks. Note that "sneak" or parasitic paths in the array which would interfere with the sensing will include a reverse-biased diode.

Figure 3:
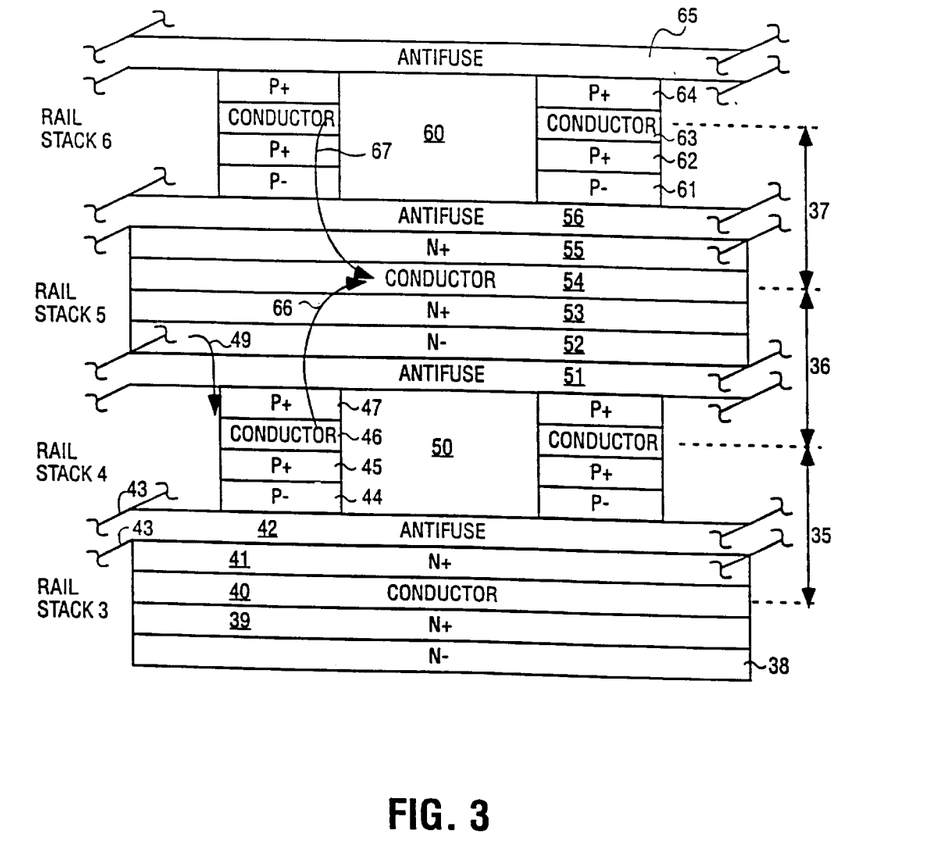
FIG. 3 is a cross-sectional elevation view of one embodiment of the present invented array.

Embodiment of FIG. 3

In the cross-section elevation view of FIG. 3, one embodiment is illustrated which corresponds to the embodiment shown in FIG. 1. In FIG. 3 the half rail-stacks of FIG. 1 are not illustrated. Three complete levels 35, 36 and 37 of the array are illustrated in FIG. 3. Below layer 38 of FIG. 3 other rail-stacks or half rail-stack are used. Also above layer 65, a full or half rail-stack is used.

The rail-stack 3 comprising layers 38 through 41 includes a lightly doped n− layer 38, a heavily doped n+ layer 39, a conductor layer 40 and n+ layer 41. The fabrication of these rail-stacks will be discussed in more detail in conjunction with FIG. 2A through FIG. 2G. An antifuse layer 42 which for the embodiment of FIG. 3 is a blanket deposition covers all of the rail-stacks formed below layer 42 as well as the fill filling the voids between the rails. As mentioned, the layer 42 is a deposited silicon dioxide layer in one embodiment.

It should be noted that n+ layers sandwich the conductor layer 40. These highly doped layers provide ohmic transitions to prevent unintended Schottky diode formation.

The layers above and below conductor 40 are not symmetrical for the embodiment illustrated in that an n− layer 38 is used below the conductor 40 and not above the conductor 40. Only a single lightly doped layer (in conjunction with a heavily doped layer) is needed to define a diode; the thickness of this lightly doped layer is important in controlling the break-down voltage and resistance of the diode so formed. The layer 41, a heavily doped semiconductor layer, and the fill are planarized after the rail-stacks are defined and then a blanket deposition of the antifuse layer 42 is formed on the layer 41. (The lines 43 in FIG. 3 are used to indicate that the antifuse layer 42 and like layers are not etched with the rail-stack below it and thus extend over the entire array for the illustrated embodiment.)

One advantage to the layer 42 and the other like layers in the structure, such as layers 51, 56 and 65, is that since they are an unbroken deposition, sidewall leakage (into the rail-stacks below) will be minimized, limiting electrical problems during reading and writing. When subsequent conductive material is deposited, it is unable to reach the sides of the rail-stacks below it because of this blanket deposition of the antifuse layer. For instance, path 49 which would allow silicon from layer 52 to cause a parasitic path does not exist because of the unbroken blanket deposition of the antifuse layer 51.

Rail-stacks 4 comprising layers 44, 45, 46 and 47 are formed on the antifuse layer 42. Layer 44 is lightly doped with a p-type dopant for the embodiment illustrated followed by a p+ layer 45, a conductive layer 46 and a p+ layer 47. After these layers are deposited, they are masked and etched to define the rail-stacks. Then the voids between these rail-stacks, such as void 50, are filled with a dielectric. The fill dielectric is planarized along with a portion of p+ layer 47. Planarization is done at this point in the fabrication since there is generally poor control over the thickness and contour of the fill. The fill tends to build up on the rail-stacks when a non-spin-on type deposition is used. This is followed by a blanket deposition of layer 51.

The process is now repeated this time beginning with an n− layer 52 followed by an n+ layer 53, a conductive layer 54 and n+ layer 55. Again after defining the rail-stacks 5, the voids are filled and the surface is planarized. Another antifuse layer 56 is deposited.

The process is repeated for the rail-stacks 6 this time beginning with a player 61, p+ layer 62, conductive layer 63, p+ layer 64. Again after defining the rail-stacks, filling the void 60 and then planarizing, another antifuse layer 65 is deposited.

As shown by the path 66, when a large enough voltage is applied between conductors 46 and 54, the antifuse layer 51, at the intersection of layers 47 and 52, is breached creating a diode at the intersection. As mentioned, this is selectively done throughout the array to program the array. The conductor 54 is therefore a bit line for the "cells" above and below it, for instance path 67 indicates another possible current path for another "cell" where the conductor 54 is again a bit line during sensing.

It should be noted that with the reversal of the p− and n− layers at each successive rail-stack, planarization for this embodiment always occurs on a heavily doped layer such as layer 47 and layer 55. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

Processing Flow for the Embodiment of FIG. 3

The process flow for forming rail-stack 5 of FIG. 3 is illustrated in FIGS. 2A–2H. It will be apparent that the rail-stacks for the other embodiment (FIGS. 4 and 5) are similarly processed.

Figure 2A:
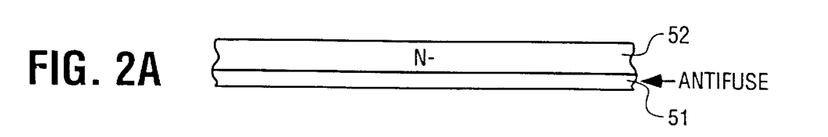
FIG. 2A is a cross-sectional elevation view of an antifuse and semiconductor layer formed during the fabrication of the invented array.

First, as shown in FIG. 2A an antifuse layer 51 is deposited. This typically is 50–200 Å of silicon dioxide which can be deposited with any one of very well-known processes. Following this, a silicon layer 52 is deposited which is typically 1000–4000 Å thick and formed with a CVD process where a phosphorous dopant is deposited along with the deposition of for instance, the polysilicon semiconductor material or where the dopant is ion implanted following the deposition of the layer. This layer is doped to a level of, for example, $1\times10^{17}/cm^3$, but can be doped to a level in a range from $1\times10^{15}/cm^3$ to $1\times10^{19}/cm^3$.

Figure 2B:
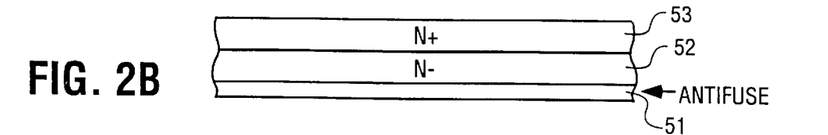
FIG. 2B illustrates the structure of FIG. 2A after an additional semiconductor layer has been formed.

Now, as shown in FIG. 2B, an n+ layer 53 is deposited again using CVD. This layer may be approximately 300–3000 Å thick and in one embodiment is doped to a level of $>10^{19}/cm^3$.

Throughout this application two adjacent silicon layers are often shown such as layers 52 and 53, with different doping. These layers may be formed with one deposition and using ion implantation steps at two different energy levels to obtain the two doping levels. Also, these differently doped layers may be formed by introducing different amounts of dopant in a diffusion process as a layer is formed.

Figure 2C:
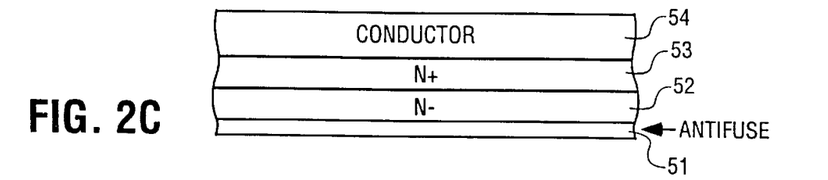
FIG. 2C illustrates the structure of FIG. 2B after a conductive layer is formed.
Figure 2D:
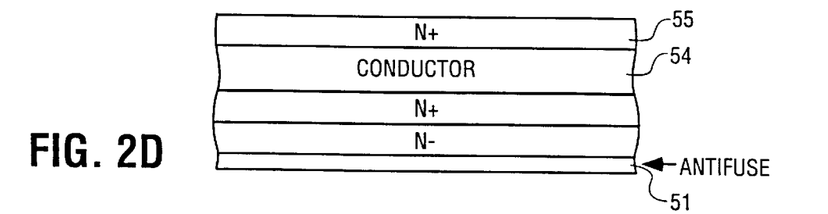
FIG. 2D illustrates the structure of FIG. 2C after an additional semiconductor layer has been formed.

A conductive layer which may be 500–1500 Å thick is formed using any one of numerous well-known thin film deposition process such as sputtering. A refractory metal may be used or a silicide of a refractory metal. Also as mentioned aluminum or copper can be used, or more simply the heavily doped silicon can be the conductor. In one embodiment, Ti and TiN layers are formed on the silicon layer and the wafer is heated to form a silicide. For instance, a Ti layer of 250 Å and a TiN layer of 70 Å are heated at 600° C. for one minute to form the silicide.

Next another semiconductor layer of, for instance, polysilicon approximately 1500–2000 Å thick is formed again doped to a level of $>10^{19}/cm^3$. This is shown as layer 55 in FIG. 2D; after planarization its thickness is between 300 Å and 2000 Å thick.

Figure 2E:
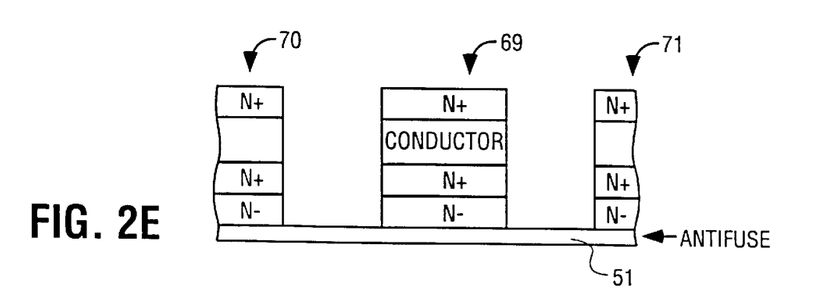
FIG. 2E illustrates the structure of FIG. 2D after a masking and etching step.

A masking and etching step is now used to define rail-stacks, such as rail-stacks 69, 70 and 71 shown in FIG. 2E. Note that when comparing this view to the view of rail-stack 5 of FIG. 3, the view in FIG. 2E is taken from the side and consequently shows the individual rail-stacks. An ordinary masking and etching step for instance using plasma etching, may be used. Etchants can be used that stop on the antifuse layer thus preventing this layer from being etched away.

Thus, layer 51 can be considered an etchant stop layer depending on the specific etchants used.

Figure 2F:
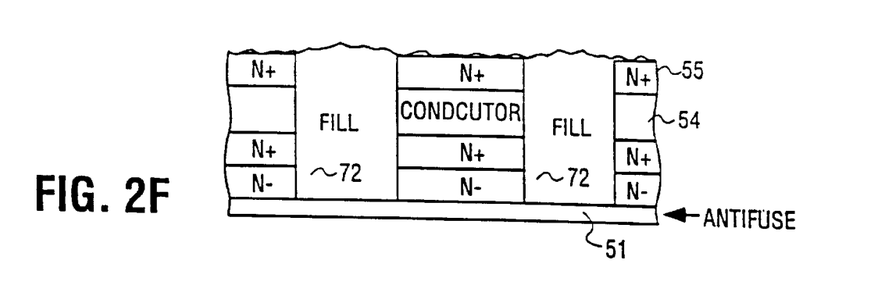
FIG. 2F illustrates the structure of FIG. 2E after open spaces left from the etching step have been filled.
Figure 2G:
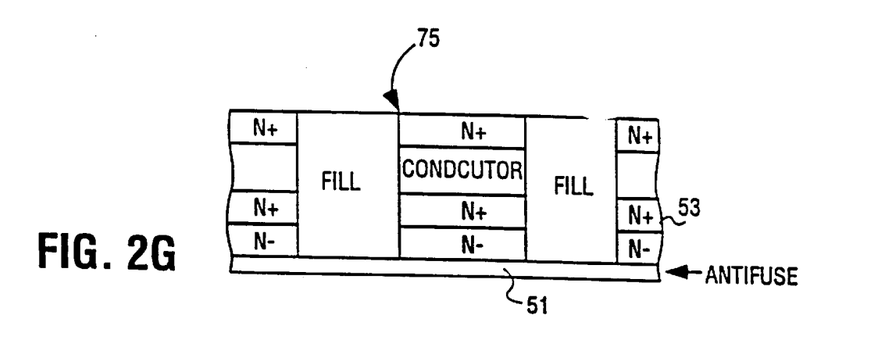
FIG. 2G illustrates the structure of FIG. 2F after a planarization step.

Now as shown in FIG. 2F, the spaces between the rail-stacks are filled with a dielectric such as formed with a HDPCVD process.

Chemical-mechanical polishing is then employed to planarize the upper surface of the rail-stacks shown in FIG. 2F in one embodiment. Chemical etching can also be used as mentioned with certain dielectrics. This planarization can reduce the thickness of the layer 55 to approximately 500 Å, thus this layer ends up being of approximately the same thickness as the layer 53.

Figure 2H:
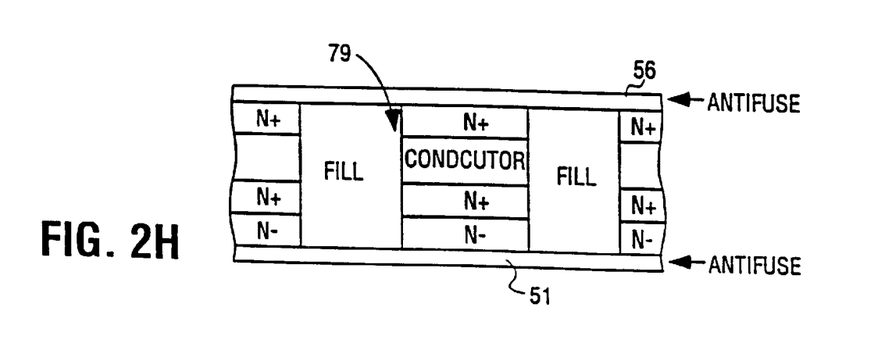
FIG. 2H illustrates the structure of FIG. 2G after another antifuse layer is formed.

Next as shown in FIG. 2H another antifuse layer 56 is formed on the planarized surface 75. Since the layer 56 is deposited over all the rail-stacks and the filler material and remains unetched, it forms a barrier to the migration of the materials subsequently deposited that might make their way along the sides of the rail-stacks such as along path 79. Thus the layer 56 helps prevent the parasitic paths and potential shorts that may occur with prior art memories.

It should be noted that in FIG. 3 while the antifuse layer is shown as a blanket layer covering the rail-stacks and fill, it is possible also to fabricate each level where the antifuse layer is in fact grown from a semiconductor layer. For instance, an oxidation step may be used to grow a silicon dioxide layer from layers 41, 47, 55 and 64. This grown layer would then be in lieu of the antifuse layers shown in FIG. 3.

Figure 7:
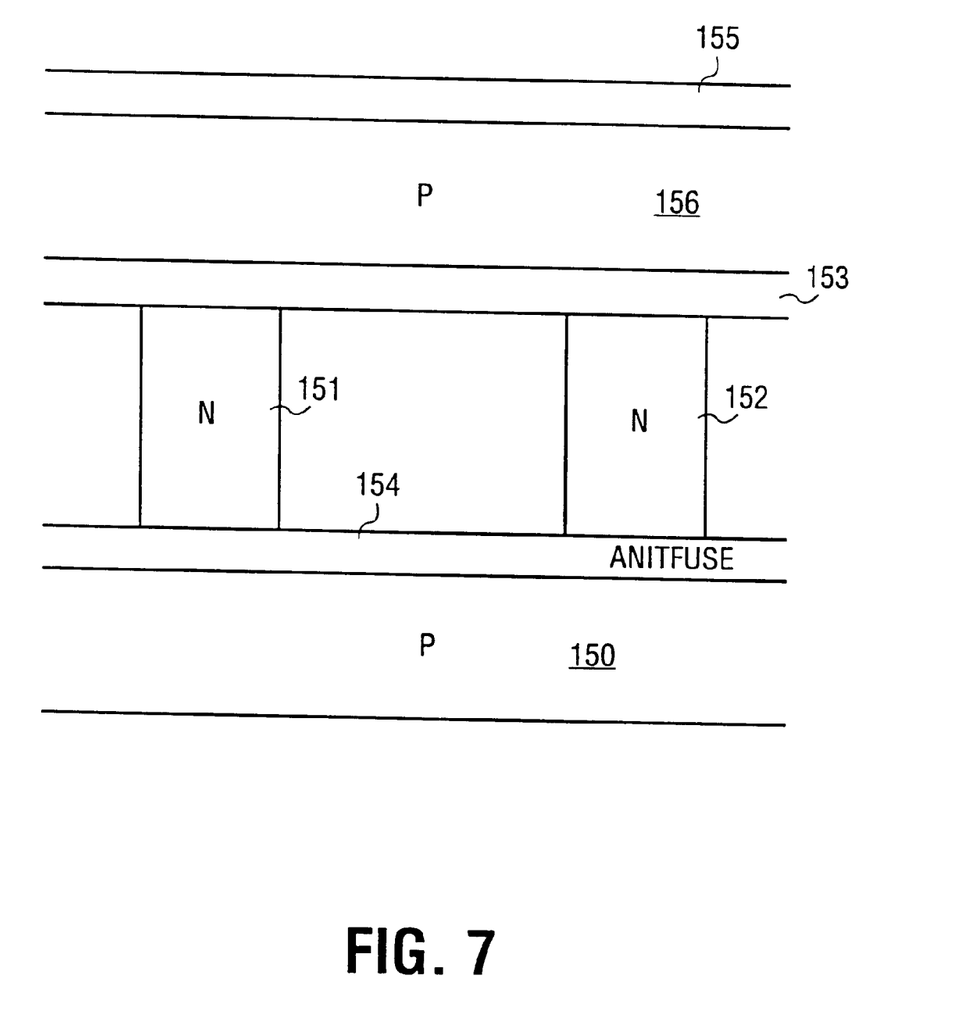
FIG. 7 is a cross-sectional elevation view of an embodiment employing rails.

In all the embodiments, the rail-stacks and rails for the embodiment of FIG. 7 are connected to circuitry in the substrate such as decoders, sense amps and like peripheral circuits. Vias for providing these connections are discussed in co-pending application Ser. No. 09/746,341, entitled "Contact and Via Structure and Method of Fabrication."

Figure 4:
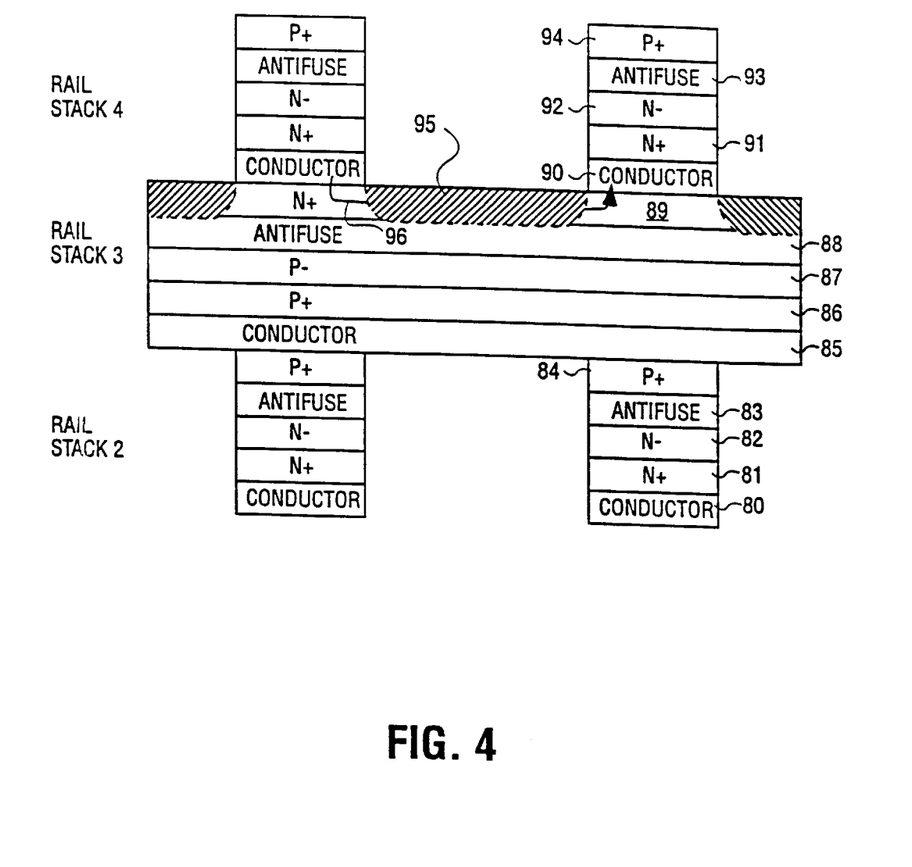
FIG. 4 is a cross-sectional elevation view of a second embodiment of the invented array.

The Embodiment of FIG. 4

For the embodiment of FIG. 4 each rail-stack begins with a conductor such as layer 80 of FIG. 4. An n+ semiconductor layer 81 and an n− layer 82 are formed on layer 80. Next a layer of antifuse material 83 is formed. Then a p+ layer 84 of semiconductor material is deposited (e.g., silicon with boron dopant) on the antifuse. When the rail-stacks are formed, for instance for rail-stack 2 of FIG. 4, the antifuse layer 83 is etched as well as layers 80, 81, 82 and 84.

The voids between the rail stacks are now filled and planarization is done, planarizing the fill with the upper surface of the layer 84. Following the completion of the rail-stack 2 the next rail-stacks are formed shown as rail-stacks 3 in FIG. 4. This comprises a conductor layer 85, p+ layer 86, p− layer 87, antifuse layer 88 and n+ layer 89. Again masking and etching occur. This etching also etches the exposed regions of layer 84 which does not appear in the view of FIG. 4, but this will be apparent shortly when region 95 of the next stack is discussed. Now filling and planarization occurs and the next layer of rail-stacks are formed shown as rail-stack 4. As illustrated, this comprises a conductive layer 90, n+ layer 91, n− layer 92, antifuse layer 93, and p+ layer 94. Once again masking, etching, filling and planarization occur.

Unlike the embodiment of FIG. 3, when rail-stacks at any particular height are formed, etching must occur on one layer of the rail-stack immediately below the rail-stack being defined. For instance, when rail-stack 4 is etched the layer 89 of rail-stack 3 is etched away where it is not covered by rail-stack 4 as shown by region 95. This etching is used to remove all of the semiconductor material between the adjacent conductors and consequently prevent a path, such as path 96 shown in FIG. 4. This etching also occurs to layer 84 which, as mentioned, is not seen in FIG. 4. In this connection the antifuse layer 88 can be used as an etchant stop, although this is not necessary. No harm is done if etching does occur through the layer 88 since the antifuse layer is only needed at the intersections of the rail-stacks. Note the etching of the region 95 is done in alignment with overlying rail-stacks and consequently no additional masking is required.

As was the case with the earlier embodiment, the order of the n and p doped layers alternate with each successive rail-stack. Moreover, the rail-stacks at any given level include both p and n layers. In contrast, for the embodiment of FIG. 3, at any particular level, the rail-stacks are doped with either an n type or p type dopant but not both.

Figure 5:
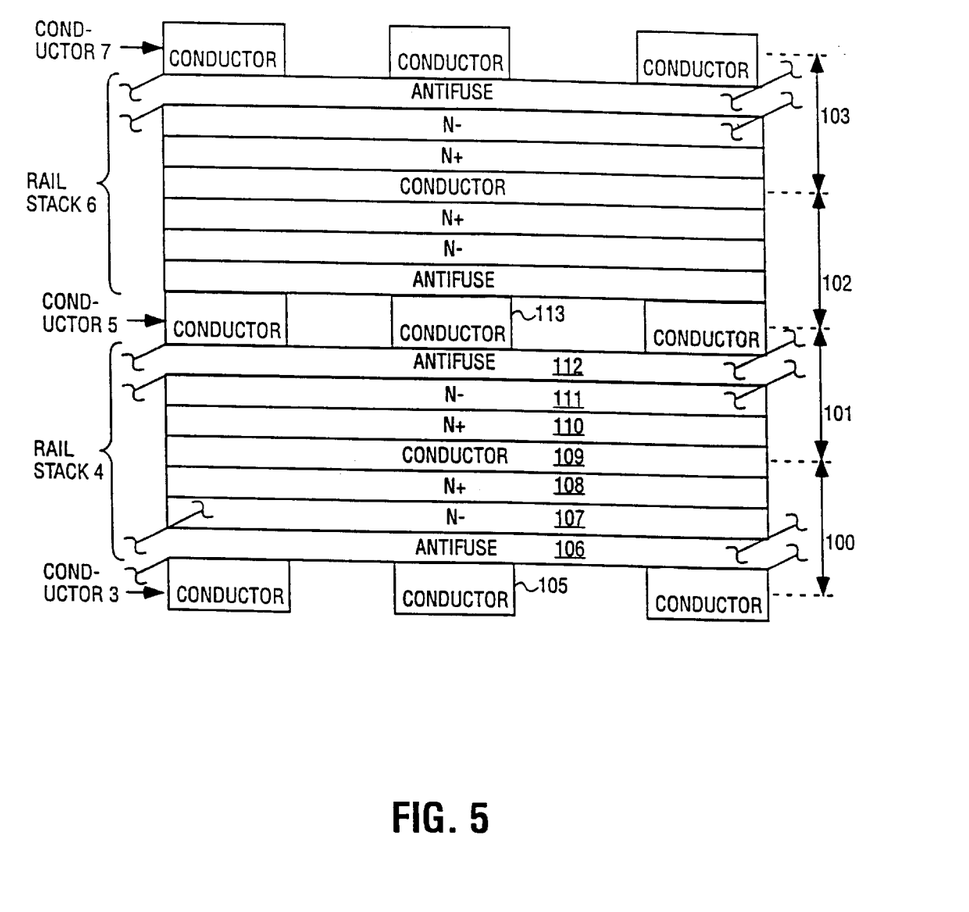
FIG. 5 is a cross-sectional elevation view of a third embodiment of the invented array.

Embodiment of FIG. 5

In the embodiment of FIG. 5, alternate levels of rail-stacks running in a first direction and intermediate layers of conductors are running in a second direction are used. For instance as shown in FIG. 5, the conductors 3, 5 and 7 run in a first direction whereas the rail-stacks 4 and 6 run in a second direction.

In this embodiment each of the rail-stacks is symmetrical about a conductor such as conductor 109 of rail-stack 4. The conductor is sandwiched between two n+ layers 108 and 10. More lightly doped outer layers 107 and 111 are disposed on these more heavily doped layers.

In fabrication the conductors such as conductors 105, are first formed, for instance, on the substrate. The spaces between these conductors may be filled and planarization may occur. Then an antifuse layer 106, n− layer 107, n+ layer 108, conductive layer 109, n+ layer 110 and n− layer 111 are deposited. Rail-stacks are then defined by masking and etching. The voids between the rail-stacks are then filled with a dielectric. Then planarization of the filling material and the upper surface of layer 111 is performed. Following this, antifuse layer 112 is deposited over the entire array. Now additional conductors are formed such as conductors 113. Each level in this array is between a metallic conductor such as conductor 105, and a sandwich conductor such as conductor 109. Thus there are four memory levels shown in FIG. 5, levels 100, 101, 102 and 103.

Programming in this array causes the formation of Schottky diodes. Consequently, the conductors such as conductors 105 and 113 must be of a suitable material to allow formation of a Schottky diode. For instance, aluminum and some refractory metal or silicides may be used.

Embodiments with Single Type PN Diodes

Figure 6:
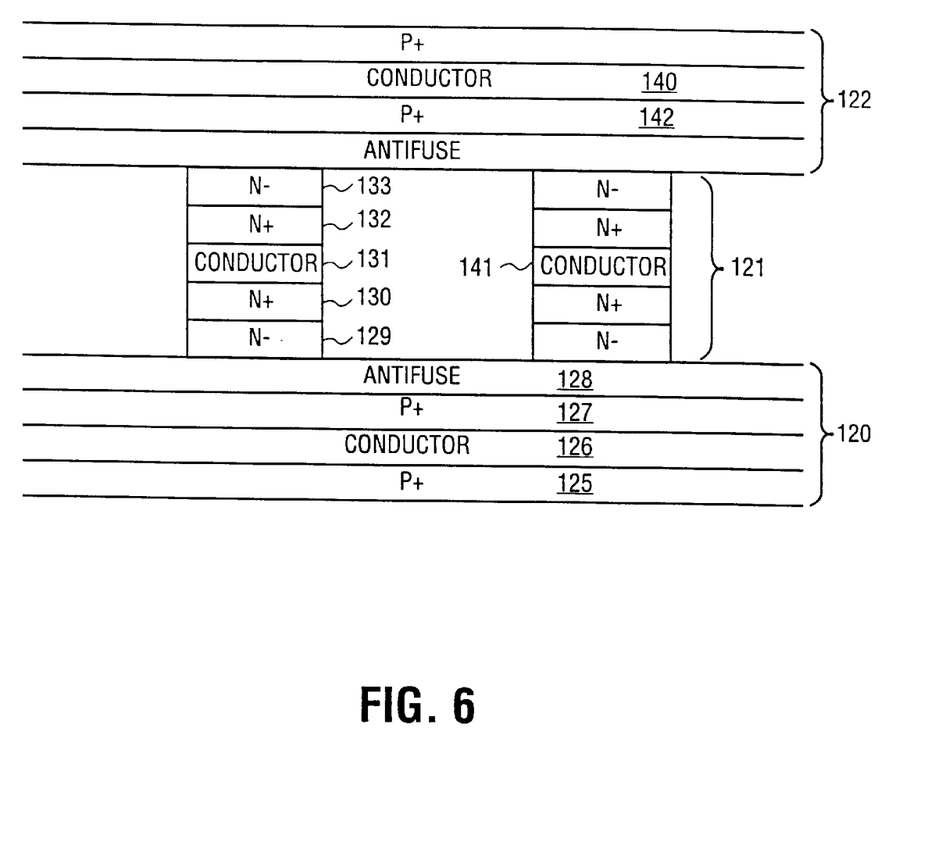
FIG. 6 is a cross-sectional elevation view of another embodiment of the invented array.

Some of the embodiments discussed above use both p−n+ and p+ n− diode types. In some processes, one of these diode types may exhibit more leakage than the other. Consequently, it may be desirable to have, for these processes, an array with only a single diode type. More specifically, assume a process has higher leakage for diodes which are p−n+ type than the same process has for diodes of the p+ n− type. FIG. 6 illustrates an array embodiment where, if the antifuse layer is breached, all the diodes will be p+ n− type, that is, there will be no diodes with a p−n+ junction.

In FIG. 6, three rail-stacks 120, 121, and 122 are illustrated which will create only a single type diode specifically, p+ n−. The first rail-stack 120 comprises: a p+ semiconductor layer 25 of, for instance, 1,000 Å thick; a conductor 126 of, for example, 500 Å thick; a p+ layer 127 of, for example, 1,000 Å thick; and a anti-fuse layer 128 of approximately 30 Å thick. These layers may be formed as discussed above. Rail-stack 121 comprises: an n− semiconductor layer 129 of, for instance, 2,000 Å thick; an n+ semiconductor layer 130 of, for example, 500 Å thick; a conductor 131 of, for instance, 500 Å thick; an n+ semiconductor layer 132 of, for instance, 500 Å thick; and an n− semiconductor layer 133 of, for example, 2,000 Å thick. The rail-stack 122 has the same layering As discussed above, the semiconductor layers may be formed using polysilicon or an amorphous silicon. The conductors may be a highly doped silicon or a metal, metal alloy, silicide or combinations thereof. The dielectric fill in the spaces between the rail-stacks is also used as discussed for the earlier embodiments.

As can be seen from FIG. 6, if the antifuse layer is breached, the diodes between the conductors 126 and 131 are all p+ n− type, and similarly, the diodes in the next level between the conductors 131 and 140 are again all p+ n− type. The rail-stacks shown are used throughout the memory array so that the entire array has only p+ n− type diodes in its memory cells.

The diodes in the illustrated rail-stacks of FIG. 6 are forward biased towards the conductor 131 and the conductor 141. If need be for a particular application, the diodes can be oriented identically, that is, with all their anodes (or cathodes) pointing upwardly. This can be obtained for the p+ n− type diodes by having both a p+ doped and n− doped semiconductor layer in each of the rail-stacks. For instance, layer 132 and 133 would be replaced with a p+ layer and layer 142 would be replaced with n− and n+ layers. This still maintains only one type of diode (p+n−) throughout the array.

While FIG. 6 shows that after the antifuse is breached, only p+n diodes will be created, an array with only p−n+ type diodes can be fabricated by replacing the p+ layers with an n+ layer and replacing the n+ and n− layers with p+ and p− layers. Also, the array can have the anodes (or cathodes) vertically aligned as discussed above for the p+n− type diodes.

It should be noted that for the embodiment of FIG. 6, planarization occurs on an n− layer, for example, the n− layer 133 is planarized before the formation of the anti-fuse layer. For this reason, layer 133 is somewhat thicker. More care is required in the polishing of the n− layer 133 to assure uniformity across the wafer and the resultant uniform diode characteristics. In this connection, a "hard" mask may be used such as described in co-pending application Ser. No. 09/746,469, filed by N. Johan Knall and James M. Cleeves, and titled *Methods Of Forming Nonvolatile Memory Devices Utilizing A Hard Mask* assigned to the assignee of the present application. One result of having thicker n− layers is that the rail-stack 121 is thicker than the rail-stacks 120 and 122.

Another array embodiment which results in single type diode junction is shown in FIG. 7. This embodiment employs rails of a uniformly doped semiconductor material rather than the rail-stacks previously discussed, which comprise layers. More specifically, as shown in FIG. 7, rails 150 of, for example, a polysilicon doped with a p− type dopant are defined from a layer of polysilicon. The spaces between these rails, as previously done with the rail-stacks, are filled with a dielectric. Then planarization occurs. An anti-fuse layer 154 is grown on, or deposited onto, the rails 150.

Now, an n− type polysilicon layer is formed and orthogonal rails 151 and 152 are photolithographically formed. Then, following a filling step, and a planarization step, another anti-fuse layer 153 is formed. Next, p− type polysilicon rails 156 are formed and an anti-fuse layer 155 is formed on these rails as shown in FIG. 7.

Each of the polysilicon rails or lines 150, 151, 152, and 156 and like lines at other levels are connected to circuitry in a substrate. Each of the rails is both a conductor and one-half a diode for cells. For instance, a cell is formed between rail 156 and rail 151, and another cell between rail 156 and rail 152. Likewise, cells are formed between the rail 150 and each of the rails 151 and 152.

The advantage to the embodiment of FIG. 7 is its ease of fabrication.

Typically, the semiconductor rails are less conductive than metal conductors previously discussed, and consequently, the rails will have more resistance. This for instance, will increase the access time of the cells, particularly in a large array. The conductivity of the rails can be improved by increasing the concentration of the p type and n type dopants. However, when this is done, the leakage current increases. For any given array, decreased resistance can be traded-off for increased leakage and vice-versa. It is contemplated that this embodiment will typically be used in a relatively small array where high-speed access is not critical.

As can be seen from FIG. 7, after the antifuse is breached, the diodes associated with each of the cells are the same; specifically the p and n type dopant concentrations for each diode is the same.

Other Embodiments

In the above description a conductor is shared by two levels. An array may be fabricated where there are two conductors for each level that are not shared with other levels. A dielectric may be used to separate each such level. Also while above diodes on alternate levels "point" in the same direction for some embodiments, this is not necessary. For instance, a shared conductor may have diodes point-in from above and point-out from below. This requires different driving circuitry in the substrate.

All the above embodiment have benefits over the prior art three-dimensional memories. One advantage is that the diodes are formed by breaching an antifuse layer. This results in diodes with very small junction areas. The resultant low-leakage diodes improves the performance of the array. Additionally, etching is not as deep as with the prior art three-dimensional memories. Difficulties with stringers where individual pillars were used in the prior art is eliminated with some of the above embodiments. The different embodiments provide numerous material choices and "postwrite diode" choices.

Thus a three-dimensional memory array has been described using rail-stacks (and for one embodiment rails) which simplifies processing and provides better performance over prior art three-dimensional arrays.

What is claimed is:

1. A memory array disposed above a substrate comprising:
   a first plurality of parallel spaced-apart rail-stacks disposed above the substrate running in a first direction;
   a second plurality of parallel spaced-apart rail-stacks disposed above the first rail-stacks, the second plurality of rail-stacks running in a second direction different than the first direction such that a projection of the second rail-stack on the first rail-stack defines intersections with the first plurality of rail-stacks;

a layer of low conducting material separating the first plurality of rail-stacks from the second plurality of rail-stacks, the layer of low conducting material at each intersection of the first and second rail-stacks separating a first conductivity type doped silicon material in one of the first rail-stacks from a second conductivity type doped silicon material in one of the second rail-stacks; and wherein the silicon on one side of each intersection is more lightly doped than the silicon on the opposite side of each intersection, such that the passage of a current equal to or greater than a predetermined threshold from one of the first rail-stacks to one of the second rail-stacks causes a diode to form at the intersection of these rail-stacks.

2. The memory array defined by claim 1 wherein the layer of low conducting material provides a physical barrier between the first and second plurality of rail-stacks, substantially minimizing sidewall leakage.

3. The memory array defined by claim 1 wherein the side of the intersection having the more lightly doped silicon includes a more heavily doped silicon region between the more lightly doped silicon and its respective conductor.

4. The memory array defined by claim 1 wherein the low conducting material comprises silicon dioxide.

5. The memory array defined by claim 1 wherein the low conducting material layer comprises silicon nitride.

6. The memory array defined by claim 1 wherein the low conducting material layer comprises undoped silicon.

7. The memory array defined by claim 1 wherein the first and second rail-stacks include a conductor comprising a metal or a metallic compound.

8. The memory array defined by claim 7 wherein each conductor is sandwiched between silicon in a multi-level array.

9. The memory array defined by claim 1 wherein the layer of low conductivity material is grown from a semiconductor layer.

10. In a multi-level memory having alternate levels of first spaced-apart conductors extending in one direction and second spaced-apart conductors in the other levels extending in a second direction, an improvement wherein each first conductor includes:

a first layer of a first conductivity type doped semiconductor material disposed on one side of the conductor over substantially its entire length;

a second layer of the first conductivity type doped semiconductor material disposed on the opposite side of the conductor over substantially its entire length;

a third layer of the first conductivity type doped semiconductor material disposed on the second layer over substantially its entire length, the third layer being more lightly doped than the second layer;

a first dielectric disposed in contact with the third layer;

a fourth layer of a second conductivity type doped semiconductor material disposed on one side of the second conductor over substantially its entire length;

a fifth layer of a second conductivity type doped semiconductor material disposed on the opposite side of the second conductor over substantially its entire length;

a sixth layer of the second conductivity type doped semiconductor material disposed on the fifth layer over substantially its entire length, the sixth layer being more lightly doped than the fifth layer; and a second dielectric disposed in contact with the sixth layer.

11. The memory defined by claim 10 wherein the semiconductor material is silicon.

12. The memory defined by claim 11 wherein the dielectric is grown from the semiconductor material.

13. The memory defined by claim 12 wherein the dielectric is silicon dioxide.

14. The memory defined by claim 11 wherein the dielectric is silicon nitride.

15. The memory defined by claim 11 wherein the dielectric extends substantially continuously between the levels.

16. The memory defined by claims 10 or 11 wherein a third dielectric is disposed on the first layer.

17. The memory defined by claim 10 wherein the memory is programmed by forming Schottky diodes at selected intersections of the first and second conductors.

18. The memory defined by claim 10 wherein the second conductivity type doped material is doped silicon.

19. In a multi-level memory having alternate levels of first spaced-apart conductors extending in one direction and second spaced-apart conductors in the other levels extending in a second direction, an improvement wherein each first conductor includes:

a first layer of a first conductivity type doped semiconductor material disposed on one side of the first conductor over substantially its entire length;

a second layer of the first conductivity type doped semiconductor material disposed on the first layer over substantially its entire length, the second layer being more lightly doped than the first layer;

a first dielectric layer disposed in contact with the second layer; and wherein only one of p+n− diodes and p−n+ diodes are formed at all levels of the array when programming occurs.

20. The memory defined by claim 19 wherein the semiconductor material is silicon.

21. The memory of claim 20 wherein the second conductors include:

a third layer of silicon doped with a second conductivity type dopant extending over substantially its entire length; and a second dielectric layer disposed on the third layer.

22. The memory defined by claim 21 wherein additional silicon layers are disposed on the first and second dielectric layers.

23. The memory defined by claim 19 wherein the first dielectric layer at each level is silicon dioxide.

24. The memory defined by claim 23 wherein each dielectric layer is substantially continuous at each level.

25. The memory defined by claim 23 wherein the dielectric layer is grown from silicon.

26. The memory defined by claim 24 wherein the dielectric layer is blanket deposited.

27. The memory defined by claim 19 wherein the first dielectric layer at each level is silicon nitride.

28. A multi-level non-volatile memory array comprising:

a plurality of first rail-stacks disposed at a first and third level running generally in a first direction above a substrate, each rail-stack comprising first conductors sandwiched between layers of silicon doped with a first conductivity type dopant;

a plurality of second rail-stacks disposed at a second and fourth level above the substrate and running in a second direction, each of the second rail-stacks comprising second conductors sandwiched between layers of silicon doped with a second conductivity type dopant, and a plurality of layers of dielectric each disposed respectively between successive levels of the first and second rail-stacks which are capable of being selectively breached to program the array.

29. The array defined by claim 28 wherein the layers of dielectric are blanket deposited.

30. The array defined by claim 28 wherein the layers of dielectric are grown on the silicon.

31. The array defined by claim 28 where the layers of dielectric are substantially continuous, forming a physical barrier between levels of rail-stacks.

32. The array defined by claim 28 wherein the layers of silicon on at least one side of the first conductors are more heavily doped adjacent to the first conductor than they are further from the first conductor.

33. The array defined by claim 32 wherein p+n− diodes are formed at all levels of the array where programming occurs.

34. The array defined by claim 32 wherein p−n+ diodes are formed at all levels of the array where programming occurs.

35. The array defined by claim 28 wherein the layers of silicon on at least one side of the second conductors are more heavily doped adjacent to the second conductors than they are further from the second conductors.

36. The array defined by claim 28 wherein the layer of dielectric comprises silicon dioxide.

37. The array defined by claim 28 wherein the layer of dielectric comprises silicon nitride.

38. The array defined by claim 28 wherein the first rail-stacks and second rail-stacks form right angles.

39. A multi-level non-volatile memory array comprising:

a plurality of first rail-stacks disposed at a first and third level running generally in a first direction above a substrate, each rail-stack comprising first conductors sandwiched between layers of silicon;

a plurality of second rail-stacks disposed at a second and fourth level above the substrate and running in a second direction, each of the second rail-stacks comprising second conductors sandwiched between layers of silicon, a plurality of dielectric regions disposed between levels of the first and second rail-stacks which are capable of being selectively breached to program the array; and where only one of p−n+ diodes and p+n− diodes are formed between each of the first and second rail-stacks where programming occurs.

40. The array defined by claim 39 wherein the dielectric regions are grown from one of the layers of silicon.

41. In a multi-level memory having alternate levels of first spaced-apart conductors extending in one direction and second spaced-apart conductors in the other levels extending in a second direction, an improvement wherein each of the first conductors includes:

a first layer of a first conductivity type doped semiconductor material disposed on one side of the first conductor over substantially its entire length;

a second layer of the first conductivity type doped semiconductor material disposed on the opposite side of the first conductor over substantially its entire length;

a third layer of the first conductivity type doped semiconductor material disposed on the first layer over substantially its entire length, the third layer being more lightly doped than the first layer;

a fourth layer of the first conductivity type doped semiconductor material disposed on the second layer over substantially its entire length, the fourth layer being more lightly doped than the second layer;

a first dielectric layer disposed in contact with the third layer;

a fifth layer of a second conductivity type doped material disposed on one side of the second conductor over substantially its entire length;

a sixth layer of the second conductivity type doped material disposed on the opposite side of the second conductor over substantially its entire length; and a second dielectric layer disposed in contact with the sixth layer.

42. The memory of claim 41 wherein the dielectric layers are formed by blanket deposition.

43. The memory of claim 41 wherein the dielectric layers are grown.

44. The memory defined by claim 43 which the semiconductor material is silicon.

45. The memory defined by claim 44 wherein the dielectric is silicon nitride.

46. The memory of claim 41 wherein the first dielectric layer is substantially continuous over at least two spaced apart conductors extending in the one direction and at least two spaced apart conductors extending in the second direction.

47. The memory defined by claim 41 where the projection of the intersection of the first and second conductors at each level defines a p+n− diode.

48. The memory defined in claim 41 wherein at the projection of the intersection of the first and second conductors at each level defines a p−n+ diode.

49. The memory defined by claim 41 wherein the semiconductor material is silicon.

50. The memory defined by claim 49 wherein the dielectric is silicon dioxide.

51. A three dimensional memory array comprising:

a plurality of first spaced-apart parallel semiconductor rails doped with a first conductivity type dopant the first rails being disposed in a first direction and disposed at even levels in the array;

a plurality of second spaced-apart parallel semiconductor rails doped with a second conductivity type dopant, the second rails being disposed in a second direction different from the first direction and disposed as odd levels in the array; and an anti-fuse layer separating at least the intersections of the first and second rails at each level.

52. The array defined by claim 51 wherein the first semiconductor rails are uniformly doped silicon rails.

53. The array defined by claim 52 wherein the second semiconductor rails are uniformly doped silicon rails.

54. The array defined by claim 51 wherein the antifuse layer is substantially continuous across the array.

55. The array defined by claims 52 or 53 wherein the antifuse material is a grown silicon dioxide layer.

56. The array defined by claims 51 or 53 wherein the antifuse material is a deposited silicon dioxide layer.

57. The array defined by claim 51 or 53 wherein the antifuse material is silicon nitride.

58. The array defined by claim 51 or 53 wherein the array is fabricated on a semiconductor substrate and each of the rails is coupled to circuitry in the substrate.

59. A multi-level non-volatile memory array comprising:
a plurality of first rail-stacks disposed at a first and third level running generally in a first direction above a substrate, each rail-stack comprising first conductors sandwiched between layers of silicon;
a plurality of second rail-stacks being thicker than the first rail-stack, disposed at a second and fourth level above the substrate and running in a second direction, each of the second rail-stacks comprising second conductors sandwiched between layers of silicon, and
a plurality of layers of dielectric each disposed respectively between successive levels of the first and second rail-stacks which are capable of being selectively breached to program the array.

60. The array defined by claim 59 wherein the layers of silicon on the first conductors are doped with a first conductivity type dopant and wherein the layers of silicon on the second conductor are doped with a second conductivity type dopant.

61. The array defined by claim 60 wherein the layers of silicon on at least one side of the first conductors are more heavily doped adjacent to the first conductor than they are further from the first conductor.

62. The array defined by claim 59 wherein p+n− diodes are formed at all levels of the array where programming occurs.

63. The array defined by claim 59 wherein p−n+ diodes are formed at all levels of the array where programming occurs.

64. The array defined by claims 59, 62, or 63 wherein the layer of dielectric comprises silicon dioxide.

65. The array defined by claim 59, 62, or 63 wherein the layer of dielectric comprises silicon nitride.

66. The array defined by claim 59, 62, or 63 wherein the first rail-stacks and second rail-stacks form right angles.

* * * * *